(12) United States Patent
Jeong et al.

(10) Patent No.: US 9,530,914 B2
(45) Date of Patent: Dec. 27, 2016

(54) METHOD FOR MANUFACTURING SOLAR CELLS HAVING NANO-MICRO COMPOSITE STRUCTURE ON SILICON SUBSTRATE AND SOLAR CELLS MANUFACTURED THEREBY

(71) Applicant: KOREA INSTITUTE OF INDUSTRIAL TECHNOLOGY, Chungcheongnam-do (KR)

(72) Inventors: Chae Hwan Jeong, Gwangju (KR); Jong Hwan Lee, Daejeon (KR); Chang Heon Kim, Gwangju (KR); Ho Sung Kim, Gyeonggi-do (KR)

(73) Assignee: KOREA INSTITUTE OF INDUSTRIAL TECHNOLOGY, Chungcheongnam-do (KR)

( * ) Notice: Subject to any disclaimer, the term of this patent is extended or adjusted under 35 U.S.C. 154(b) by 0 days.

(21) Appl. No.: 14/437,183

(22) PCT Filed: Dec. 18, 2012

(86) PCT No.: PCT/KR2012/011085
§ 371 (c)(1),
(2) Date: Apr. 20, 2015

(87) PCT Pub. No.: WO2014/065465
PCT Pub. Date: May 1, 2014

(65) Prior Publication Data
US 2015/0270425 A1  Sep. 24, 2015

(30) Foreign Application Priority Data

Oct. 25, 2012 (KR) ........................ 10-2012-0119306
Oct. 25, 2012 (KR) ........................ 10-2012-0119307
Oct. 25, 2012 (KR) ........................ 10-2012-0119308

(51) Int. Cl.
*H01L 31/0224* (2006.01)
*H01L 31/0352* (2006.01)
(Continued)

(52) U.S. Cl.
CPC ... *H01L 31/03529* (2013.01); *H01L 31/02363* (2013.01); *H01L 31/022425* (2013.01);
(Continued)

(58) Field of Classification Search
CPC ............... H01L 21/0405; H01L 21/042; H01L 21/0425; H01L 21/048; H01L 21/38; H01L 21/40; H01L 21/44; H01L 21/702
See application file for complete search history.

(56) References Cited

U.S. PATENT DOCUMENTS

2007/0148336 A1  6/2007  Bachrach et al.
2010/0233539 A1  9/2010  Green et al.
(Continued)

FOREIGN PATENT DOCUMENTS

CN   101305454   11/2008
CN   101390198    3/2009
(Continued)

OTHER PUBLICATIONS

International Search Report mailed Jun. 27, 20123 for PCT/KR2012/011085.
(Continued)

*Primary Examiner* — Cheung Lee (57) ABSTRACT

One embodiment of the present invention relates to a method for manufacturing solar cells having a nano-micro composite structure on a silicon substrate and solar cells manufactured thereby. The technical problem to be solved is to provide a method for manufacturing solar cells and solar cells manufactured thereby, the method being capable of forming micro wires in various sizes according to the lithographic design of a photoresist and forming nano wires, which have various sizes and aspect ratios, by adjusting the concentration of a wet etching solution and immersion time.

8 Claims, 10 Drawing Sheets

(51) Int. Cl.
*H01L 31/0236* (2006.01)
*H01L 31/18* (2006.01)
(52) U.S. Cl.
CPC ...... *H01L 31/035227* (2013.01); *H01L 31/18* (2013.01); *Y02E 10/50* (2013.01)

(56) References Cited

U.S. PATENT DOCUMENTS

| | | |
|---|---|---|
| 2011/0147342 A1 | 6/2011 | Chiang et al. |
| 2011/0294255 A1 | 12/2011 | Lin et al. |
| 2012/0090673 A1 | 4/2012 | Dimitrov et al. |

FOREIGN PATENT DOCUMENTS

| | | |
|---|---|---|
| KR | 10-2008-0075156 | 8/2011 |
| KR | 10-1182681 | 9/2012 |
| TW | 201218406 | 5/2012 |

OTHER PUBLICATIONS

Office Action dated Apr. 20, 2016 corresponding to Chinese Patent Application No. 201280076576.5, 9 pages.

METHOD FOR MANUFACTURING SOLAR CELLS HAVING NANO-MICRO COMPOSITE STRUCTURE ON SILICON SUBSTRATE AND SOLAR CELLS MANUFACTURED THEREBY

This application claims the priority of Korean Patent Application Nos. 10-2012-0119306, 10-2012-0119307, and 10-2012-0119308, filed on Oct. 25, 2012, Oct. 25, 2012, and Oct. 25, 2012 in the KIPO (Korean Intellectual Property Office), the disclosure of which is incorporated herein entirely by reference. Further, this application is the National Stage application of International Application No. PCT/KR2012/011085, filed Dec. 18, 2012, which designates the United States and was published in Korean. Each of these applications is hereby incorporated by reference in their entirety into the present application.

TECHNICAL FIELD

Embodiments relate to a method of manufacturing a solar cell having a nano and micro composite structure of a silicon substrate and a solar cell manufactured thereby.

BACKGROUND ART

In general, solar cells have a PN junction. Electrons and holes are generated when the light is incident on the PN junction, the electrons and holes respectively move to a P region and an N region, a potential (electromotive force) is generated between the P region and the N region due to the above phenomenon, and at this time, a current flows when a load is connected to the solar cell.

The solar cells may be broadly classified as one using a silicon semiconductor material and one using a compound semiconductor material. Also, the solar cells using a silicon semiconductor may be classified as crystalline solar cells and amorphous solar cells.

Currently, most of solar cells generally used in a solar power system are silicon semiconductors. In particular, single crystalline and polycrystalline solar cells of a crystalline silicon semiconductor have been widely used due to good conversion efficiency and high reliability.

DISCLOSURE OF THE INVENTION

Technical Problem

An aspect of the present invention provides a method of manufacturing a solar cell, in which microwires with various sizes may be formed according to the lithographic design of a photoresist and nanowires with various sizes and aspect ratios may also be formed by adjusting the concentration of a wet etching solution and immersion time, and a solar cell manufactured thereby.

Technical Solution

According to at least one of embodiments, a method of manufacturing a solar cell includes preparing a first conductive type semiconductor substrate having a first surface and a second surface, patterning a photoresist on the second surface of the first conductive type semiconductor substrate in such a manner that a planar form of the photoresist is a form in which a plurality of transverse lines and a plurality of vertical lines intersect, electroless etching the semiconductor substrate to form a microwire having a width of 1 µm to 3 µm and a height of 3 µm to 5 µm in a region corresponding to the photoresist and form a plurality of nanowires having a width of 1 nm to 100 nm and a height of 1 µm to 3 µm in a region not corresponding to the photoresist, doping the microwire and the nanowire with a second conductive type impurity using $POCl_3$, forming a first electrode on the first surface of the semiconductor substrate, and forming a second electrode on the microwire, wherein an efficiency, a ratio of an output to an incident light energy per unit area, of the solar cell is in a range of 10% to 13%.

Herein, the electroless etching may include first immersing in which a protective layer is formed on the first surface of the semiconductor substrate and the semiconductor substrate is immersed in a mixed solution of a silver nitrate solution and a hydrofluoric acid solution, second immersing in which the semiconductor substrate having silver particles attached thereto from the silver nitrate solution is immersed in a mixed solution of a hydrogen peroxide solution and a hydrofluoric acid solution, and third immersing in which the semiconductor substrate is immersed in a mixed solution of a nitric acid solution and water to remove the silver particles.

In the first immersing, the silver nitrate solution may have a concentration of 5 mM to 15 mM, and the hydrofluoric acid solution may have a concentration of 2 mM to 8 mM.

The hydrogen peroxide solution and the hydrofluoric acid solution of the second immersing may each have a concentration of 2 mM to 8 mM.

The nanowires may be formed by the second immersing and the second immersing may be performed for 1 minute to 12 minutes.

The electroless etching may further include second electroless etching in which the nanowires are etched to form a flat groove area by immersing the semiconductor substrate in a mixed solution of a potassium hydroxide solution and water, after first electroless etching including the first, second, and third immersing.

The electroless etching may include forming microwires in which the microwires are formed by patterning the photoresist on the second surface of the first conductive type substrate, depositing $AgNO_3$ in which the $AgNO_3$ is deposited on the second surface of the first conductive type substrate on which the microwires are not formed, and forming nanowires in which the nanowires are formed by etching the $AgNO_3$ with a KOH solution.

The second conductive type impurity doping using the $POCl_3$ may be performed at 820° C. to 880° C.

According to another embodiment, a solar cell includes a first conductive type semiconductor substrate, a plurality of microwires having a width of 1 µm to 3 µm and a height of 3 µm to 5 µm which is formed on a top surface of the semiconductor substrate in such a manner that a planar form of the microwires is a form in which a plurality of transverse lines and a plurality of vertical lines intersect, a plurality of nanowires having a width of 1 nm to 100 nm and a height of 1 µm to 3 µm which is formed at an outer side of the microwire to increase a path of light, a second conductive type impurity doped region which is formed by doping a surface of the microwire with a second conducive type impurity using $POCl_3$, a first electrode formed on a bottom surface of the semiconductor substrate, and a second electrode formed on a surface of the second conductive type impurity doped region, wherein an efficiency, a ratio of an output to an incident light energy per unit area, of the solar cell is in a range of 10% to 13%.

Herein, the nanowires may be etched to form a flat groove area.

Advantageous Effects

The present disclosure provides a method of manufacturing a solar cell, in which microwires and nanowires may be simultaneously formed, and a solar cell manufactured thereby.

An embodiment of the present disclosure provides a method of manufacturing a solar cell, in which microwires with various sizes may be formed according to the lithographic design of a photoresist and nanowires with various sizes and aspect ratios may also be formed by adjusting the concentration of a wet etching solution and the immersion time of a semiconductor substrate, and a solar cell manufactured thereby.

An embodiment of the present disclosure provides a method of manufacturing a solar cell, in which nanowires are formed by using a wet etching method, which is inexpensive and requires a short processing time, instead of a dry etching method which is expensive and requires a long processing time, and a solar cell manufactured thereby.

An embodiment of the present disclosure provides a method of manufacturing a solar cell, in which the reflectivity of the incident light is significantly lower than that of a typical planar structure due to a plurality of microwires and nanowires and thus, it is highly efficient, and a solar cell manufactured thereby. That is, the present disclosure provides a method of manufacturing a solar cell, in which the path of the incident light is increased by applying a microwire and nanowire structure, instead of a typical planar structure, to a light-absorbing layer, a current value is increased due to the occurrence of quantum effects such as photon confinement, and eventually, efficiency is increased, and a solar cell manufactured thereby.

MODE FOR CARRYING OUT THE INVENTION

Example embodiments will now be described more fully hereinafter with reference to the accompanying drawings to fully explain the present disclosure in such a manner that it may easily be carried out by a person with ordinary skill in the art to which the present disclosure pertains.

Hereinafter, a method of manufacturing a solar cell according to an embodiment of the present disclosure will be described.

Figure 1:
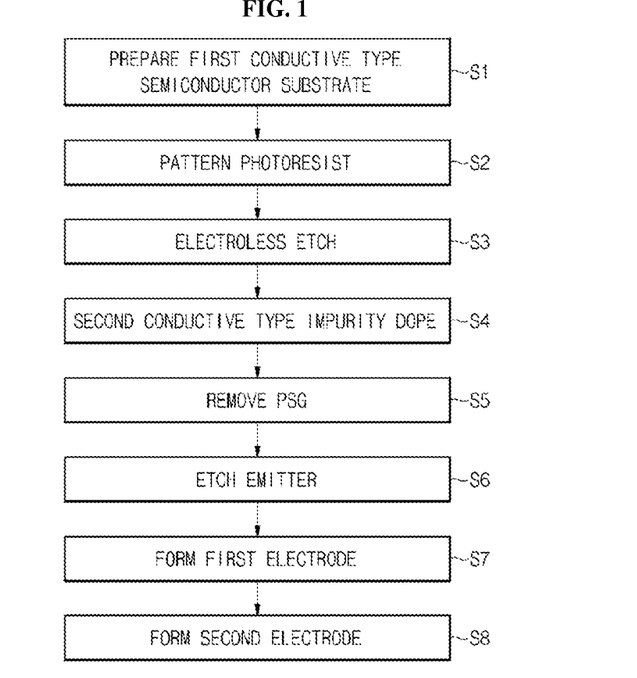
FIG. 1 is a flowchart illustrating a method of manufacturing a solar cell according to an embodiment of the present disclosure.

FIG. 1 is a flowchart illustrating a method of manufacturing a solar cell according to an embodiment of the present disclosure.

As illustrated in FIG. 1, the method of manufacturing a solar cell according to the embodiment of the present disclosure may include a first conductive type semiconductor substrate preparing step S1, a photoresist patterning step S2, an electroless etching step S3, a second conductive type impurity doping step S4, a phosphor silicate glass (PSG) removing step S5, an emitter etching step S6, a first electrode forming step S7, and a second electrode forming step S8.

FIGS. 2A to 2H are partial cross-sectional views sequentially illustrating the method of manufacturing a solar cell according to the embodiment of the present disclosure. Hereinafter, referring together to FIG. 1, the method of manufacturing a solar cell according to the embodiment of the present disclosure will be described.

Figure 2A:
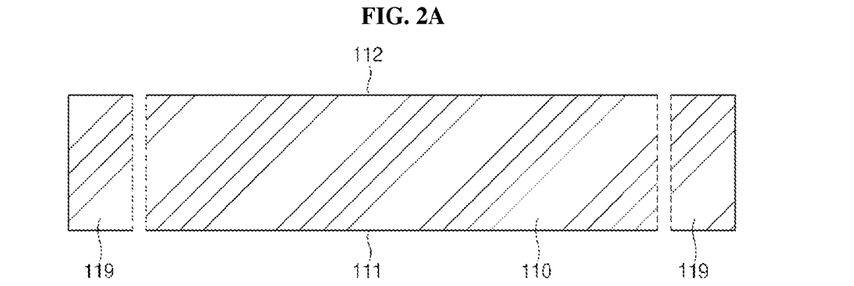
FIGS. 2A to 2H are partial cross-sectional views sequentially illustrating the method of manufacturing a solar cell according to the embodiment of the present disclosure.

Referring to FIGS. 1 and 2A, in the first conductive type semiconductor substrate preparing step S1, a first conductive type semiconductor substrate 110 having an approximately flat first surface (bottom surface) 111 and an approximately flat second surface (top surface) 112 as an opposite surface is prepared. For example, the semiconductor substrate 110 may be a P-type silicon semiconductor substrate. That is, the semiconductor substrate 110 may be a P-type silicon semiconductor substrate in which a silicon semiconductor substrate is doped with an impurity, such as boron (B) or gallium (Ga), a Group 13 element of the Periodic Table of Elements.

Two parallel dotted lines in the drawings denote an omitted area in the semiconductor substrate 110, and an area outside of the dotted lines denotes an edge area 119.

Figure 2B:
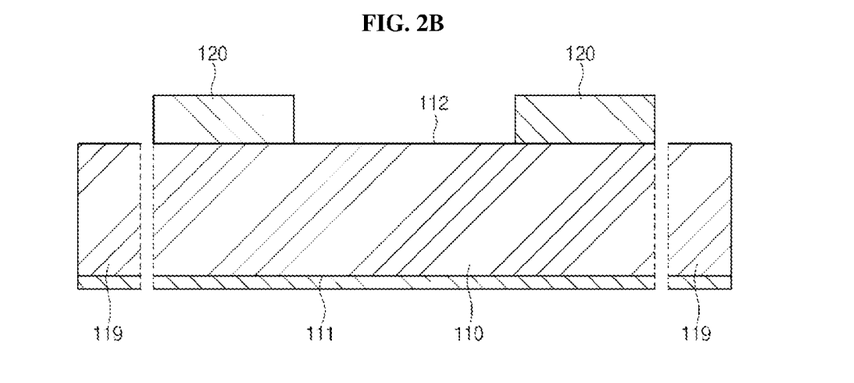

Referring to FIGS. 1 and 2B, in the photoresist patterning step S2, the second surface 112 of the semiconductor substrate 110 is coated with a photoresist 120 having a predetermined thickness and the photoresist 120 is patterned by a typical photolithography process. Herein, a microwire 113 is later formed in a region of the semiconductor substrate 110 corresponding to the photoresist 120, and a plurality of nanowires 114 is later formed in a region not corresponding to the photoresist 120. In addition, after the photoresist patterning step S2, a protective layer 121 having a predetermined thickness may be formed on the first surface 111 of the semiconductor substrate 110. The protective layer 121 may include any one of a typical insulation layer, a metal layer, and equivalents thereof. Any material may be used as the protective layer 121 as long as it does not react with a wet etching solution which will be described later.

Furthermore, a planar form of the photoresist 120 may be a checkerboard pattern form or a matrix form. That is, the photoresist 120 is formed in the plurality of checkerboard pattern forms or matrix forms at inner sides of the four edge areas 119 of the semiconductor substrate 110. However, only the two patterned photoresist 120 are illustrated in the drawings for the understanding of the present disclosure.

Figure 2C:
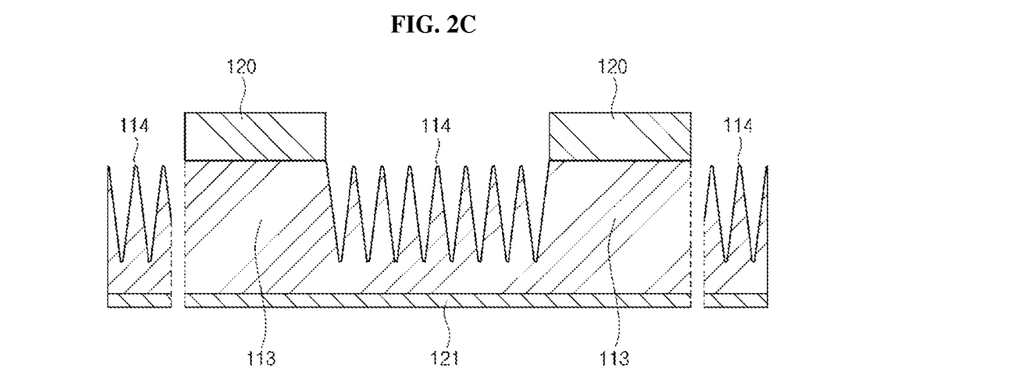

Referring to FIGS. 1 and 2C, in the electroless etching step S3, although it will be later described in more detail, the plurality of nanowires 114 is formed in the second surface 112 of the semiconductor substrate 110 which corresponds to the region, in which the photoresist 120 is not formed, by immersing the semiconductor substrate 110 in a wet etching solution having a predetermined concentration for a predetermined time. As described above, the microwire 113 is formed in the second surface 112 of the semiconductor substrate 110 corresponding to the region in which the photoresist 120 is formed. Accordingly, the plurality of microwires 113 and the plurality of nanowires 114 are formed in the second surface 112 of the semiconductor substrate 110. Herein, the microwire 113 denotes that its width is in a micrometer scale, and the nanowire 114 denotes that it width is in a nanometer scale.

Specifically, the width of the microwire 113 may be in a range of about 1 μm to about 3 μm, and a height thereof may be in a range of about 3 μm to about 5 μm. Also, the width of the nanowire 114 may be in a range of about 1 nm to about 100 μm, and a height thereof may be in a range of about 1 μm to about 3 μm. However, the above values are merely provided as an example for understanding the present disclosure, the values may be changed by the design of the photoresist 120 or adjusting the concentration of the wet etching solution and immersion time.

In addition, after the electroless etching step S3, the photoresist 120 and the protective layer 121 are removed from the semiconductor substrate 110. However, in some cases, the protective layer 121 may be removed after a doping process.

Furthermore, since the planar form of the photoresist 120 is a checkerboard pattern form or a matrix form, a planar form of the microwire 113 is also a checkerboard pattern form or a matrix form. In other words, the planar form of the microwire 113 denotes a form in which a plurality of transverse lines and a plurality of vertical lines intersect.

Figure 2D:
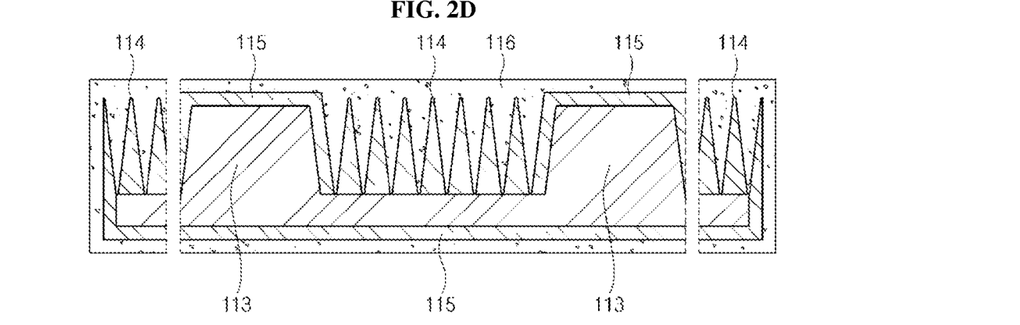

Referring to FIGS. 1 and 2D, in the second conductive type impurity doping step S4, a second conductive type impurity doped region 115 is formed in the semiconductor substrate 110 by doping the microwire 113 and the nanowire 114 with a second conductive type impurity. That is, a PN junction region is formed in the semiconductor substrate 110. For example, the microwire 113 and the nanowire 114 may be doped with an impurity, such as phosphorus (P), arsenic (As), or antimony (Sb), a Group 15 element of the Periodic Table of Elements. In addition, since a doping depth may be about 0.5 μm, a PN junction region in a radial shape is formed in the microwire 113 and the entire nanowire 114 substantially becomes an N-region.

Thus, the nanowire 114, instead of acting as a PN junction region, may generate quantum effects, such as photon confinement, by increasing the path of the light incident on a solar cell, thereby increasing the efficiency of the solar cell.

In a case where the doping process is performed by using a compound including P, phosphor silicate glass (PSG) 116 may be formed on a surface of the semiconductor substrate 110, and the PSG 116 may be removed in the next process. However, in a case where P ions are directly injected into the semiconductor substrate 110, the above PSG removal process is not necessary.

Figure 2E:
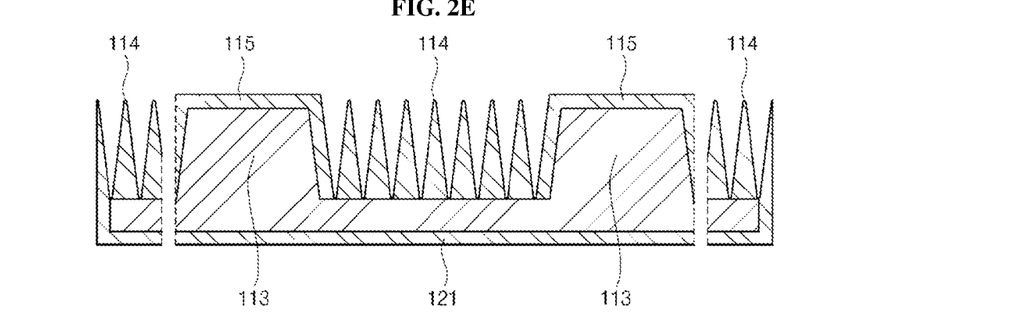

Referring to FIGS. 1 and 2E, in the phosphor silicate glass (PSG) removing step S5, the PSG 116 surrounding the entire surfaces (top surface, bottom surface, and side surfaces) of the semiconductor substrate 110 are removed by a typical etching solution.

Figure 2F:
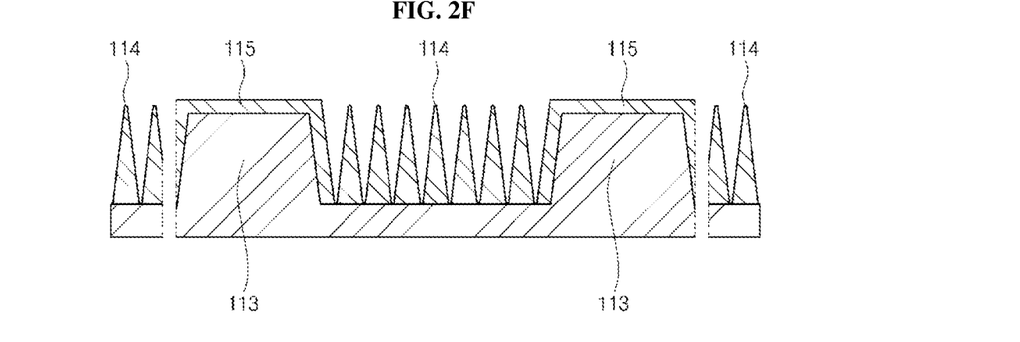

Referring to FIGS. 1 and 2F, in the emitter etching step S6, the entire surfaces (top surface, bottom surface, and side surfaces) of the semiconductor substrate 110 are etched to a predetermined depth. In particular, since the PN junction regions formed at the bottom surface and side surfaces of the semiconductor substrate 110 are removed by etching, leakage current may be minimized during the operation of the solar cell.

Thus, only a first conductive type region (P-type region), for example, is present in the bottom surface of the semiconductor substrate 110 and a second conductive type region (N-type region) is present in the top surface.

Figure 2G:
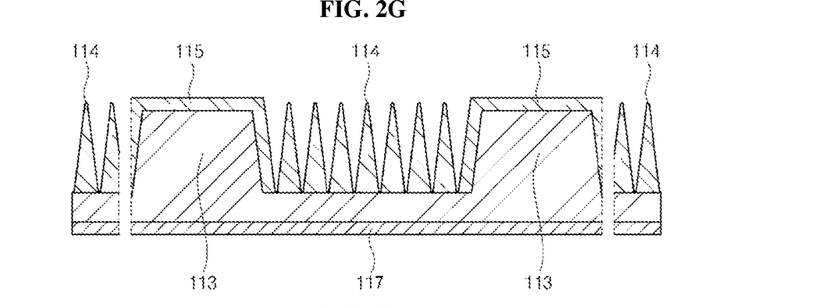

Referring to FIGS. 1 and 2G, in the first electrode forming step S7, a first electrode 117 is formed on the first surface 111 of the semiconductor substrate 110. For example, one selected from aluminum and an equivalent thereof is screen-printed on the first surface 111 of the semiconductor substrate 110 to form the first electrode 117. Herein, the first electrode 117 denotes a collector electrode.

Figure 2H:
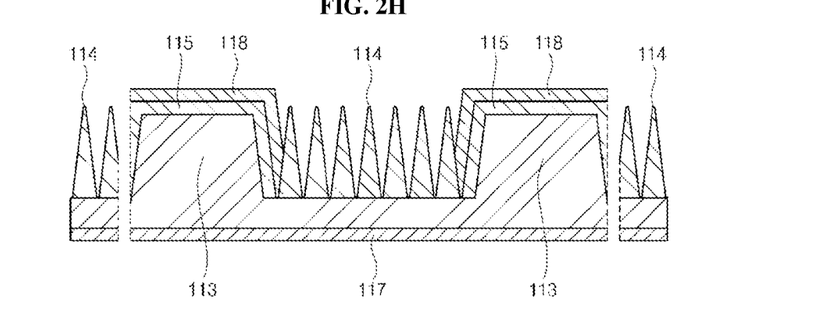

Referring to FIGS. 1 and 2H, in the second electrode forming step S8, a second electrode 118 is formed on a surface of the microwire 113 which is formed on the second surface 112 of the semiconductor substrate 110. More precisely, the second electrode 118 is formed on a surface of the second conductive type impurity doped region 115 which is formed on the microwire 113. For example, one selected from silver and an equivalent thereof is screen-printed on the surface of the second conductive type impurity doped region 115 to form the second electrode 118. Herein, the second electrode 118 denotes an emitter electrode.

Thus, a solar cell 100 according to the present disclosure may include the first conductive type semiconductor substrate 110, the plurality of microwires 113 formed in a checkerboard pattern form or a matrix form on the top surface of the semiconductor substrate 110, the second conductive type impurity doped region 115 formed by doping the surface of the microwire 113 with a second conductive type impurity, the plurality of nanowires 114 formed at an outer side of the microwire 113, the first electrode 117 formed on the bottom surface of the semiconductor substrate 110, and the second electrode 118 formed on the surface of the second conductive type impurity doped region 115.

Therefore, in the solar cell 100 according to the present disclosure, the microwires 113 are formed in a checkerboard pattern form or a matrix form on the single semiconductor substrate 110, and a PN junction region in a radial shape, instead of a planar shape, is formed in the microwire 113. Accordingly, the efficiency of the solar cell is improved by increasing an area of the PN junction region. Furthermore, the plurality of nanowires 114 is formed around the microwire 113. Since the nanowires 114 increase the path of the incident light to cause quantum effects such as photon confinement, the nanowires 114 may further increase the efficiency of the solar cell.

Figure 3:
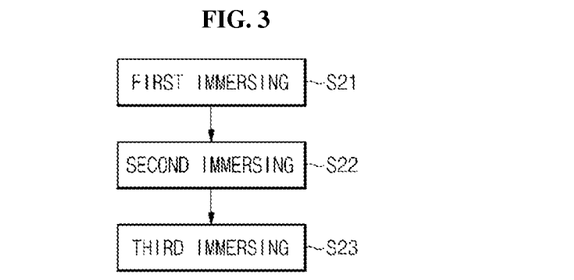
FIG. 3 is a flowchart sequentially illustrating an electroless etching method in the method of manufacturing a solar cell according to the embodiment of the present disclosure.

FIG. 3 is a flowchart sequentially illustrating an electroless etching method in the method of manufacturing a solar cell according to the embodiment of the present disclosure.

As illustrated in FIG. 3, the electroless etching method may include a first immersion step S21, a second immersion step S22, and a third immersion step S23.

Figure 4A:
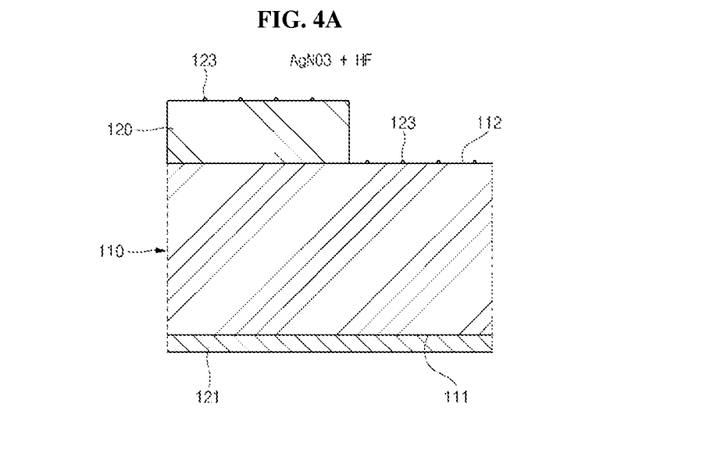
FIGS. 4A to 4C are partial cross-sectional views sequentially illustrating the electroless etching method in the method of manufacturing a solar cell according to the embodiment of the present disclosure.
Figure 4B:
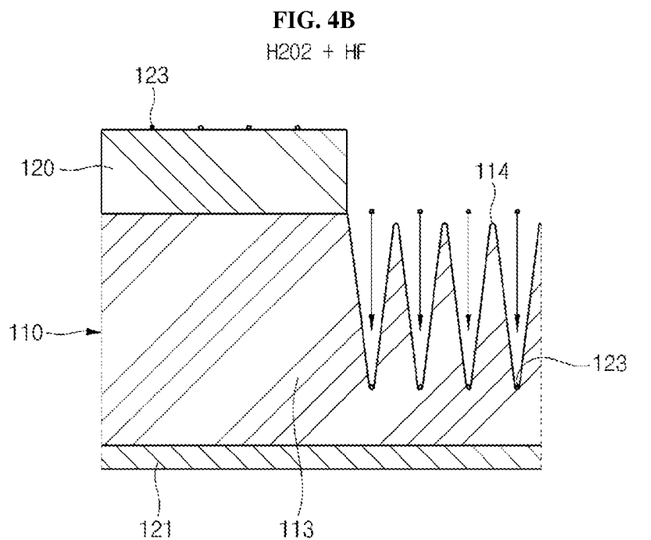
Figure 4C:
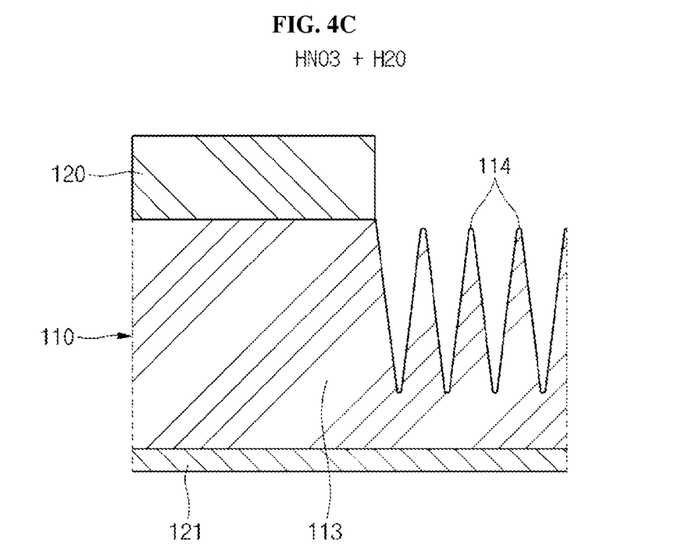

FIGS. 4A to 4C are partial cross-sectional views sequentially illustrating the electroless etching method in the method of manufacturing a solar cell according to the embodiment of the present disclosure. Hereinafter, referring together to FIG. 3, the electroless etching method will be described.

Referring to FIGS. 3 and 4A, in the first immersion step S21, since the semiconductor substrate 110 is immersed in a mixed solution of a silver nitrate ($AgNO_3$) solution and a hydrofluoric acid (HF) solution, a plurality of silver particles 123 is physically bonded to the photoresist 120 and the second surface 112 of the semiconductor substrate 110. Herein, the silver nitrate solution has a concentration of about 5 mM to about 15 mM, and the hydrofluoric acid solution has a concentration of about 2 mM to about 8 mM. In addition, the amount of the silver particles 123 formed on the second surface 112 of the semiconductor substrate 110 may be appropriately controlled by appropriately adjusting the concentration of the solution and the immersion time of the semiconductor substrate 110.

Referring to FIGS. 3 and 4B, in the second immersion step S22, since the semiconductor substrate 110, to which the silver particles 123 are bonded as described above, is immersed in a mixed solution of a hydrogen peroxide ($H_2O_2$) solution and a hydrofluoric acid solution, the plurality of nanowires 114 is formed in the second surface 112 of the semiconductor substrate 110. Herein, the photoresist 120 does not react with the mixed solution of the $H_2O_2$ solution and the hydrofluoric acid solution.

Also, herein, the hydrogen peroxide solution and the hydrofluoric acid solution may each have a concentration of about 2 mM to about 8 mM. Furthermore, the immersion may be performed for about 1 minute to about 12 minutes. For example, it was observed that the nanowires 114 having a depth of about 2.5 μm were formed when the semiconductor substrate 110 is immersed in the mixed solution for about 2 minutes, the nanowires 114 having a depth of about 5 μm were formed when the semiconductor substrate 110 is immersed in the mixed solution for about 6 minutes, and the nanowires 114 having a depth of about 7.5 μm were formed when the semiconductor substrate 110 is immersed in the mixed solution for about 10 minutes.

Although a phenomenon, in which etching relatively rapidly proceeds in a contact area between the silver particle 123 and semiconductor substrate 110, becomes clear when further research is conducted, the present inventors consider that it is a phenomenon that occurs when the etching solution promotes a vigorous oxidation reaction to occur at an interface between silver and silicon.

The silver particles 123 may remain in a valley between the nanowire 114 and the nanowire 114 due to the above phenomenon, and the silver particles 123 may need to be removed to inhibit the leakage current.

Referring to FIGS. 3 and 4C, in the third immersion step S23, since the semiconductor substrate 110, in which the nanowires 114 are formed as described above, is immersed in a mixed solution of a nitric acid ($HNO_3$) solution and water ($H_2O$), silver present in the valley between the nanowire 114 and the nanowire 114 is removed. Herein, a volume ratio of the nitric acid solution to the water may be about 3:1, but the present disclosure is not limited thereto.

Thus, the embodiment of the present disclosure provides the method of manufacturing a solar cell, in which the microwires 113 and the nanowires 114 may be simultaneously formed, and the solar cell manufactured thereby.

The embodiment of the present disclosure also provides a method of manufacturing a solar cell, in which the microwires 113 with various sizes may be formed according to the lithographic design of the photoresist 120 and the nanowires 114 with various sizes and aspect ratios may also be formed by adjusting the concentration of a wet etching solution and the immersion time of the semiconductor substrate 110, and a solar cell manufactured thereby.

The embodiment of the present disclosure also provides a method of manufacturing a solar cell, in which the nanowires 114 are formed by using a wet etching method, which is inexpensive and requires a short processing time, instead of a dry etching method which is expensive and requires a long processing time, and a solar cell manufactured thereby. That is, both inductively coupled plasma (ICP) apparatus and reactive ion etching (RIE) apparatus, i.e., typical dry etching apparatuses, are expensive because these apparatuses perform processing in a vacuum environment, and excessive maintenance costs are required because these apparatuses are operated in a clean room. However, since a typical wet etching process is used in the present disclosure, a solar cell may be inexpensively manufactured.

The embodiment of the present disclosure also provides a method of manufacturing a solar cell, in which the reflectivity of the incident light is significantly lower than that of a typical planar structure due to the plurality of microwires 113 and nanowires 114 and thus, it is highly efficient, and a solar cell manufactured thereby. That is, the present disclosure provides a method of manufacturing a solar cell, in which the path of the incident light is increased by applying a structure of microwires 113 and nanowires 114, instead of a typical planar structure, to a light-absorbing layer, a current value is increased due to the occurrence of quantum effects such as photon confinement, and eventually, the efficiency is increased, and a solar cell manufactured thereby.

Hereinafter, a method of manufacturing a solar cell according to another embodiment of the present disclosure will be described. The method of manufacturing a solar cell according to the another embodiment of the present disclosure is the same as the method of manufacturing a solar cell according to the embodiment of the present disclosure except that only the electroless etching step S3 is different. Thus, hereinafter, an electroless etching step of the method of manufacturing a solar cell according to the another embodiment of the present disclosure will be mainly described.

Figure 5:
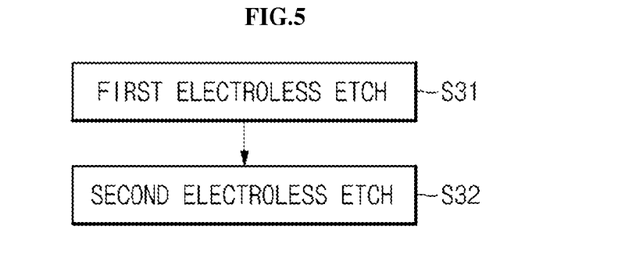
FIG. 5 is a flowchart sequentially illustrating an electroless etching method in a method of manufacturing a solar cell according to another embodiment of the present disclosure.

FIG. 5 is a flowchart sequentially illustrating an electroless etching method in the method of manufacturing a solar cell according to the another embodiment of the present disclosure.

As illustrated in FIG. 5, the electroless etching method may include a first electroless etching step S31 and a second electroless etching step S32.

Also, the first electroless etching step S31 may be performed in the same manner as in the electroless etching step S3 of the method of manufacturing a solar cell according to the embodiment of the present disclosure.

Figure 6A:
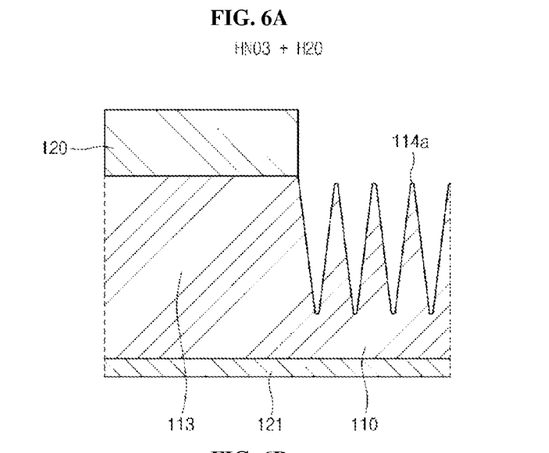
FIGS. 6A and 6B are partial cross-sectional views sequentially illustrating the electroless etching method in the method of manufacturing a solar cell according to the another embodiment of the present disclosure.
Figure 6B:
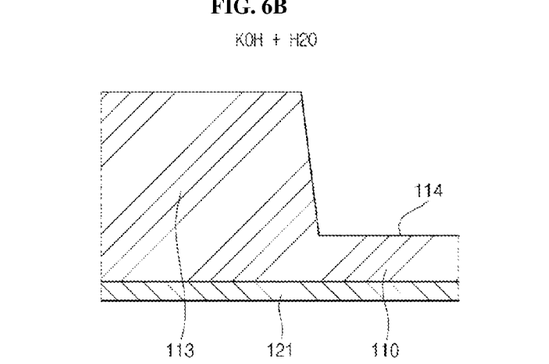

FIGS. 6A and 6B are partial cross-sectional views sequentially illustrating the electroless etching method in the method of manufacturing a solar cell according to the another embodiment of the present disclosure. Hereinafter, referring together to FIG. 5, the electroless etching method will be described.

Referring to FIGS. 5 and 6A, in the first electroless etching step S31, microwires 113 and nanowires 114a are formed in the semiconductor substrate 110 by the electroless etching step S3 of the method of manufacturing a solar cell according to the embodiment of the present disclosure.

Referring to FIGS. 5 and 6B, in the second electroless etching step S32, an approximately flat groove area 114 is formed by etching the nanowires 114a by immersing the semiconductor substrate 110 in a mixed solution of a potassium hydroxide (KOH) solution and water. Since the groove area 114 is formed by etching the nanowires 114a, the groove area may not be approximately flat, but may have an uneven surface. That is, the groove area 114 may have an embossed shape or an irregular shape.

In the second electroless etching step S32, a volume ratio of the potassium hydroxide solution to the water may be about 1:10, but the present disclosure is not limited thereto. Also, a weight ratio of the potassium hydroxide solution to the water may be about 10 wt %:90 wt %, but the present disclosure is not limited thereto. Hydrochloric acid or nitric acid may also be used in addition to the potassium hydroxide, but the present inventors recognized that potassium hydroxide is the most suitable for removing the nanowires 114a.

Also, it is appropriate that immersion time of the semiconductor substrate 110 is in a range of about 30 seconds to about 40 seconds. In the case that the immersion time is less than about 30 seconds, the nanowires 114a are not sufficiently removed, and in the case in which the immersion time is greater than about 40 seconds, the nanowires 114a are excessively removed.

Figure 7:
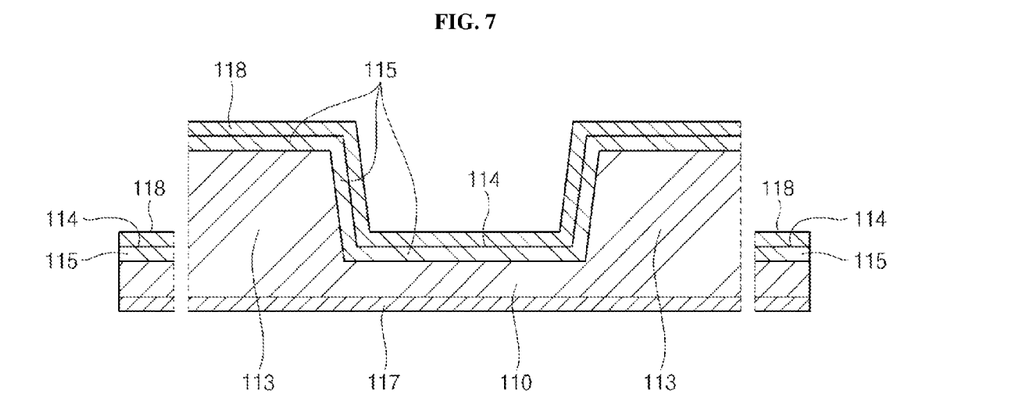
FIG. 7 is a partial cross-sectional view illustrating a solar cell according to another embodiment of the present disclosure.

FIG. 7 is a partial cross-sectional view illustrating a solar cell according to another embodiment of the present disclosure.

Referring to FIG. 7, microwires 113 and a groove area 114 having an uneven embossed shape or an irregular shape, which is formed at the outer side of the microwires 113 by etching the nanowires 114a, are formed in a first surface of a semiconductor substrate 110.

Thus, the another embodiment of the present disclosure provides a method of manufacturing a solar cell, in which the microwires 113 with various sizes may be formed according to the lithographic design of the photoresist 120 and the microwires 113 with various sizes and aspect ratios may also be formed by adjusting the concentration of a wet etching solution and the immersion time of the semiconductor substrate 110, and a solar cell manufactured thereby.

The another embodiment of the present disclosure also provides a method of manufacturing a solar cell, in which the microwires 113 are formed by using a wet etching method, which is inexpensive and requires a short processing time, instead of a dry etching method which is expensive and requires a long processing time, and a solar cell manufactured thereby. That is, both inductively coupled plasma (ICP) apparatus and reactive ion etching (RIE) apparatus, i.e., typical dry etching apparatuses, are expensive because these apparatuses perform processing in a vacuum environment, and excessive maintenance costs are required because these apparatuses are operated in a clean room. However, since a typical wet etching process is used in the present disclosure, a solar cell may be inexpensively manufactured.

The another embodiment of the present disclosure also provides a method of manufacturing a solar cell, in which the reflectivity of the incident light is significantly lower than that of a typical planar structure due to the plurality of microwires 113 and thus, it is highly efficient, and a solar cell manufactured thereby. That is, the present disclosure provides a method of manufacturing a solar cell, in which the path of the incident light is increased by applying a structure of the plurality of microwires 113, instead of a typical planar structure, to a light-absorbing layer, a current value is increased due to the occurrence of quantum effects such as photon confinement, and eventually, the efficiency is increased, and a solar cell manufactured thereby.

In addition, the another embodiment of the present disclosure provides a method of manufacturing a solar cell, in which a PN junction region is significantly increased in comparison to a typical structure by forming the PN junction region to have an irregular shape, a spherical wave shape, a sine wave shape, or a square wave shape, and accordingly, the efficiency is increased, and a solar cell manufactured thereby.

Hereinafter, a method of manufacturing a solar cell according to another embodiment of the present disclosure will be described. The method of manufacturing a solar cell according to the another embodiment of the present disclosure is the same as the method of manufacturing a solar cell according to the embodiment of the present disclosure except that only the electroless etching step S3 is different. Also, in the method of manufacturing a solar cell according to the another embodiment of the present disclosure, a second conductive type impurity may be doped by using $POCl_3$ in the second conductive type impurity doping step S4. Thus, hereinafter, an electroless etching step and the doping of the second conductive type impurity using $POCl_3$ in the method of manufacturing a solar cell according to the another embodiment of the present disclosure will be mainly described.

Figure 8:
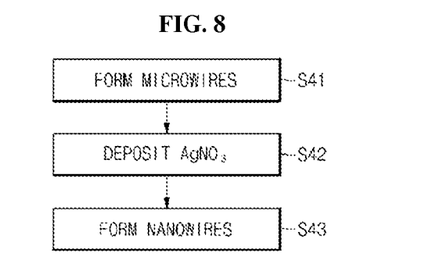
FIG. 8 is a flowchart sequentially illustrating an electroless etching method in a method of manufacturing a solar cell according to another embodiment of the present disclosure.

FIG. 8 is a flowchart sequentially illustrating an electroless etching method in the method of manufacturing a solar cell according to the another embodiment of the present disclosure.

As illustrated in FIG. 8, the electroless etching method may include a microwire forming step S41, an $AgNO_3$ depositing step S42, and a nanowire forming step S43.

Figure 9A:
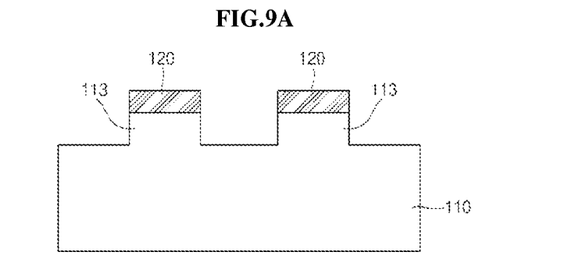
FIGS. 9A to 9C are partial cross-sectional views sequentially illustrating the electroless etching method in the method of manufacturing a solar cell according to the another embodiment of the present disclosure.
Figure 9B:
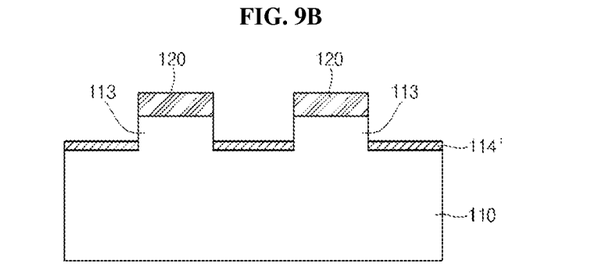
Figure 9C:
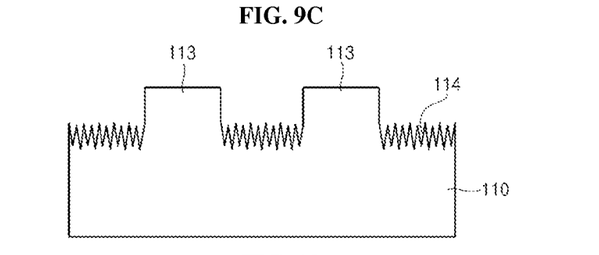

FIGS. 9A to 9C are partial cross-sectional views sequentially illustrating the electroless etching method in the method of manufacturing a solar cell according to the another embodiment of the present disclosure. Hereinafter, referring together to FIG. 8, the electroless etching step will be described.

Referring to FIGS. 8 and 9A, in the microwire forming step S41, microwires 113 are formed by etching the semiconductor substrate 110. In this case, although not illustrated in FIG. 9A, a protective layer may be formed on the bottom of the semiconductor substrate 110. The protective layer may include any one of a typical insulation layer, a metal layer, and equivalents thereof, and any material may be used as long as it does not react with an etching solution.

The semiconductor substrate 110 is etched by using the photoresist 120 as a mask. As a result, a region, in which the photoresist 120 is not formed, is removed, and the microwire 113 is formed in a region in which the photoresist 120 is formed. The microwire 113 may be formed to have a width of about 1 μm to about 3 μm and a height of about 3 μm to about 5 μm. However, the above values are merely provided as an example for understanding the present disclosure, and the scope of the present disclosure is not limited thereto.

Referring to FIGS. 8 and 9B, in the $AgNO_3$ depositing step S42, $AgNO_3$ is deposited on a region of the top of the semiconductor substrate 110, in which the microwire 113 is not formed, i.e., the region etched in the microwire forming step S41, to form a $AgNO_3$ layer 114'. The $AgNO_3$ layer 114' is later etched to form nanowires 114.

Referring to FIGS. 8 and 9C, in the nanowire forming step S43, the semiconductor substrate 110 is etched by the $AgNO_3$ layer 114' to form the nanowires 114. In this case, KOH may be used as an etching solution. Silver (Ag) particles of the $AgNO_3$ layer 114' may vigorously react with KOH during the etching. Thus, the region, on which the Ag particles are deposited, of the semiconductor substrate 110 is more etched due to the vigorous reaction with KOH, and a region, on which the Ag particles is not deposited, is relatively less etched. This is the reason that the nanowires 114 in FIG. 9C are formed to have a non-uniform height. The nanowires 114 may be formed to have a width of about 1 nm to about 100 nm and a height of about 1 μm to about 3 μm. However, the above values are merely provided as an example for understanding the present disclosure, and the scope of the present disclosure is not limited thereto.

In addition, in the nanowire forming step S43, the photoresist 120 and the protective layer may be removed by etching.

Figure 10:
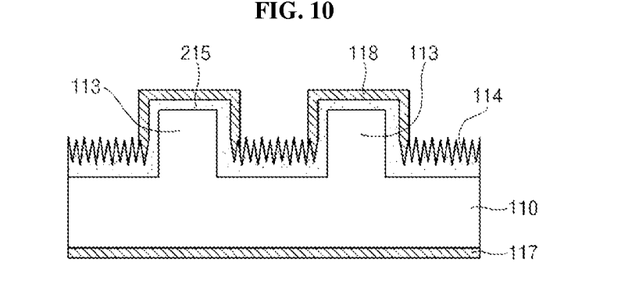
FIG. 10 is a partial cross-sectional view illustrating a solar cell according to another embodiment of the present disclosure.
Figure 11A:
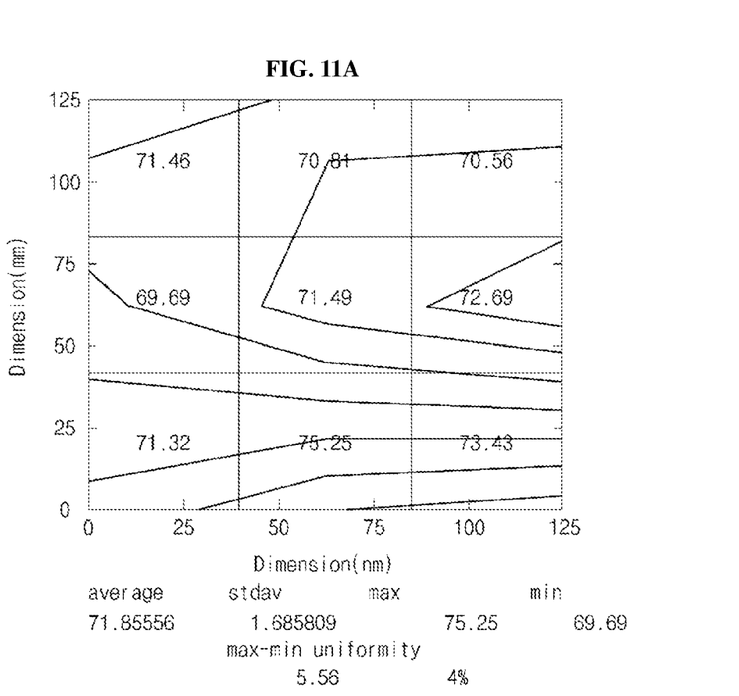
FIGS. 11A to 11D are graphs illustrating sheet resistances which are measured by changing the temperature of a second conductive type impurity doping process using $POCl_3$ as 820° C., 840° C., 860° C., and 880° C. in the solar cell according to the another embodiment of the present disclosure.
Figure 11B:
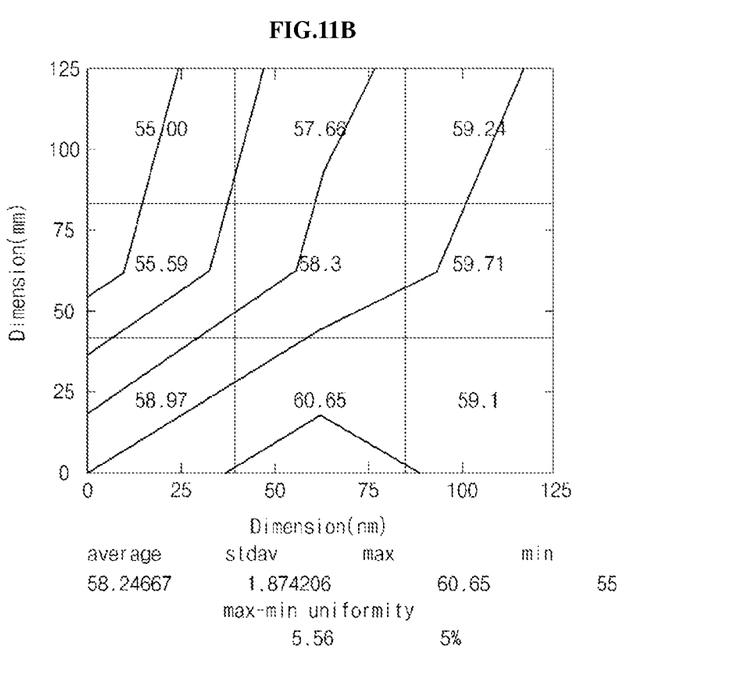
Figure 11C:
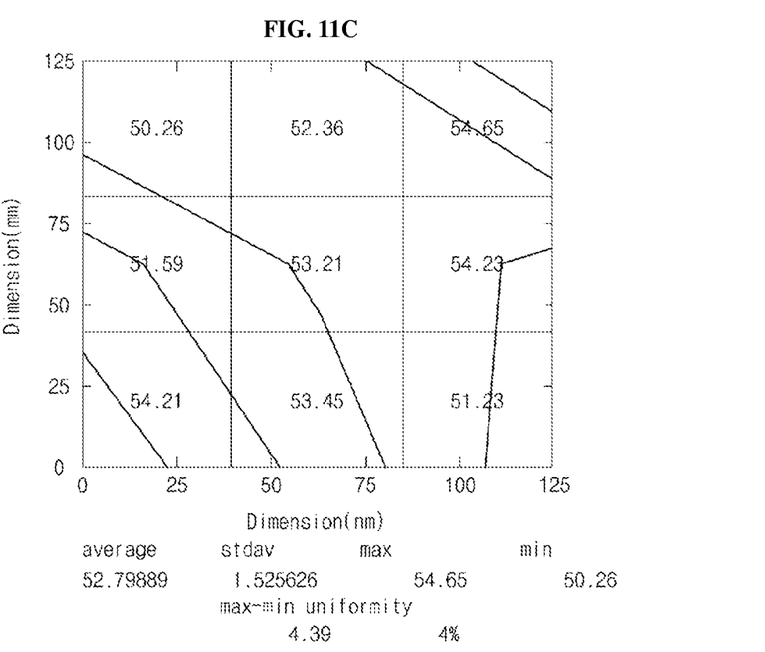
Figure 11D:
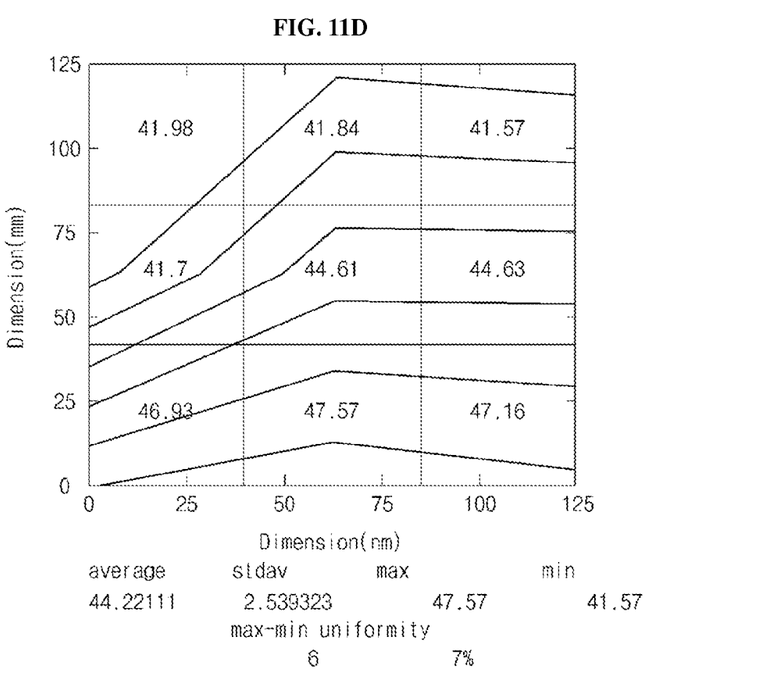

FIG. 10 is a partial cross-sectional view illustrating a solar cell according to another embodiment of the present disclosure.

Referring to FIG. 10, the solar cell according to the another embodiment of the present disclosure may include a first conductive type semiconductor substrate 110, a plurality of microwires 113 formed in a checkerboard pattern form or a matrix form on a top surface of the semiconductor substrate 110, a second conductive type impurity doped region 215 formed on a surface of the microwire 113 by using $POCl_3$, a plurality of nanowires 114 formed at an outer side of the microwire 113, a first electrode 117 formed at a bottom surface of the semiconductor substrate 110, and a second electrode 118 formed on a surface of the second conductive type impurity doped region 215.

Thus, in the solar cell according to the another embodiment of the present disclosure, the microwires 113 are formed in a checkerboard pattern form or a matrix form on the single semiconductor substrate 110, and a PN junction region in a radial shape, instead of a planar shape, is formed in the microwire 113. Accordingly, the efficiency of the solar cell is improved by increasing an area of the PN junction region. Furthermore, the plurality of nanowires 114 is formed around the microwire 113. Since the nanowires 114 increase the path of the incident light to cause quantum effects such as photon confinement, the nanowires 114 may further increase the efficiency of the solar cell.

Hereinafter, characteristics of the solar cell, according to another embodiment of the present disclosure, according to various conditions will be described.

Since a solar cell basically uses a PN junction, $POCl_3$ or $H_3PO_4$, for example, is deposited and diffused at a high temperature in order to form a second conductive type (N-type) impurity layer on a first conductive type (P-type) semiconductor substrate. The second conductive type (N-type) impurity layer formed in this case is denoted as an emitter layer. In the solar cell according to the another embodiment of the present disclosure, an emitter layer is formed by doping a second conductive type impurity using $POCl_3$.

The doping of the second conductive type impurity using $POCl_3$ includes a pre-deposition process as step 1 and a drive-in diffusion process, in which the impurity is injected into silicon at a high temperature of 850° C. or more, as step 2. In the pre-deposition process, $POCl_3$ is injected into the semiconductor substrate 110, the microwires 113, and the nanowires 114 at a temperature of about 810° C. A $P_2O_5$ oxide layer is formed on surfaces of the semiconductor substrate 110, the microwires 113, and the nanowires 114 during the above process. In the subsequent diffusion process, phosphorus (P) of the $P_2O_5$ layer is diffused into silicon (Si) of the semiconductor substrate by performing a heat treatment at a temperature of about 820° C. to about 860° C., and thus, an emitter layer 215, i.e., a second conducive type (N-type) impurity layer, is formed.

Conditions of the doping of the second conductive type impurity using POCl3 in the solar cell according to the another embodiment of the present disclosure are listed in Table 1.

TABLE 1

| Doping process | Ramp up | Stability time | Pre depo. | Drive in 1 | Drive in 2 | Ramp down |
|---|---|---|---|---|---|---|
| $O_2$ | 300 sccm | 100 sccm | 300 sccm | x | 100 sccm | 300 sccm |
| $N_2$ | 1 L | 1 L | 1 L | 1 L | 1 L | 5 L |
| POC13 | x | 200 sccm | x | x | 200 sccm | x |
| Time (min) | | 60 | 21 | 25 | 12 | |

FIGS. 11A to 11D are graphs illustrating sheet resistances which are measured by changing the temperature of the second conductive type impurity doping process using $POCl_3$ as 820° C., 840° C., 860° C., and 880° C. in the solar cell according to the another embodiment of the present disclosure. An optimum temperature required for the solar cell having a nano/micro composite structure was obtained by the sheet resistance measurement according to the changes in the temperature. As a result, average sheet resistance at 860° C. was 52.79889, in which this value was the most similar to the sheet resistance of a current commercial product. Although sheet resistance at 880° C. was 44.22111 which was the lowest value, the low sheet resistance also denoted that the amount of the impurity was large. Thus, since the amount of leakage current may be increased, the doping process at 880° C. was inadequate. That is, it may be understood that the doping process at 860° C., which exhibited the value that was the most similar to that of the commercial product, was the most adequate.

Figure 12:
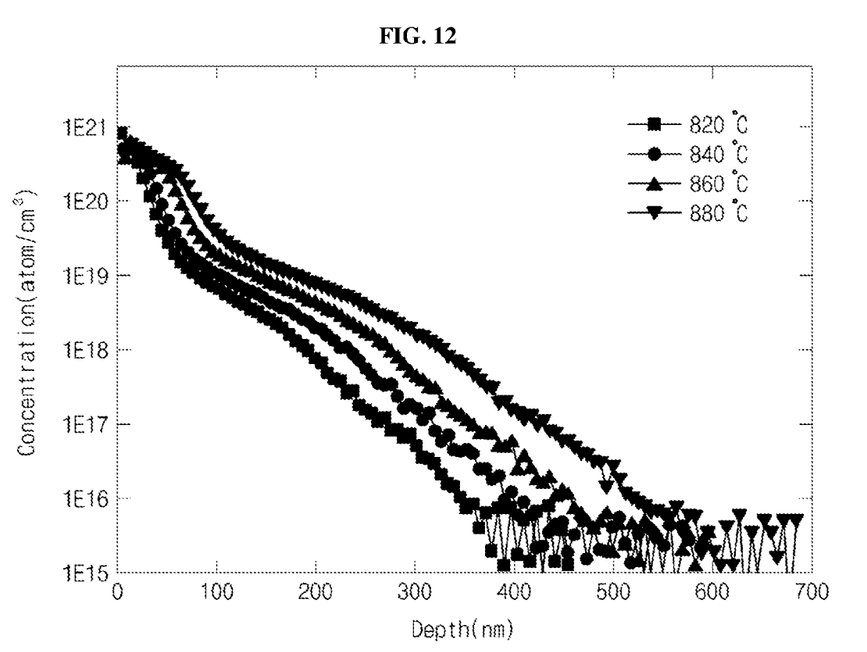
FIG. 12 is a graph in which an atomic concentration according to a depth after the second conductive type impurity doping using $POCl_3$ is measured according to changes in doping temperature in the solar cell according to the another embodiment of the present disclosure.

FIG. 12 is a graph in which an atomic concentration according to a depth after the second conductive type impurity doping using $POCl_3$ is measured according to changes in doping temperature in the solar cell according to the another embodiment of the present disclosure. The above process was performed by secondary ion mass spectrometry (SIMS) profile analysis and the optimized depth of a microwire PN junction may be obtained.

Referring to FIG. 12, it may be understood that a concentration of atom according to the depth after the second conductive type impurity doping using $POCl_3$ was proportional to the temperature and the concentration was generally decreased as the depth was increased. Also, from the measured value at the optimum temperature of 860° C., it may be understood that the optimized depth of the microwire PN junction was 0.5 μm.

Figure 13:
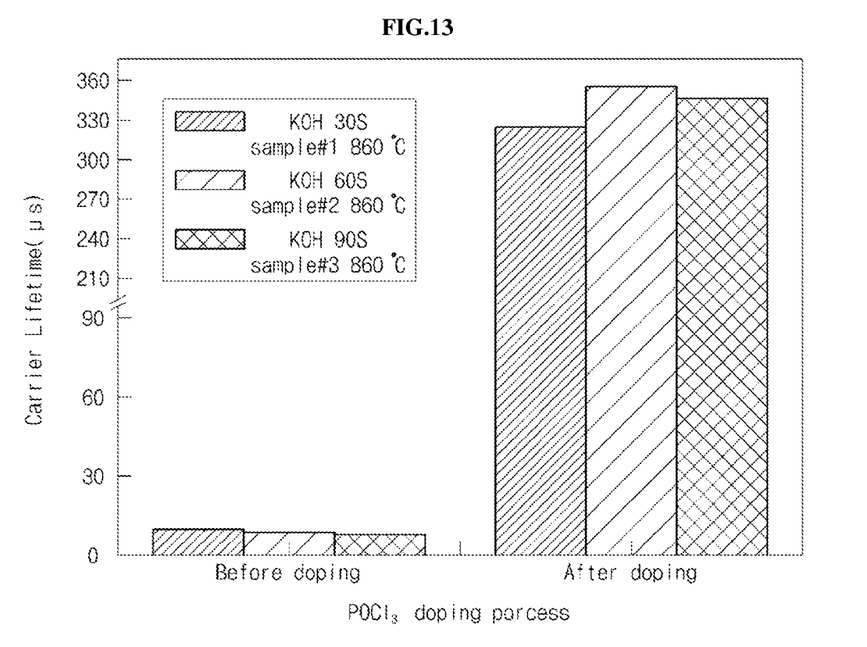
FIG. 13 is a graph in which carrier lifetime before and after the second conductive type impurity doping using $POCl_3$ is measured according to etching time in the solar cell according to the another embodiment of the present disclosure.

FIG. 13 is a graph in which carrier lifetime before and after the second conductive type impurity doping using $POCl_3$ is measured according to the etching time in the solar cell according to the another embodiment of the present disclosure. Herein, KOH may be used as an etching solution. The carrier lifetime was about 10 μs before the doping of the second conductive type impurity using $POCl_3$, but a carrier lifetime of about 300 μs may be obtained after the doping.

Figure 14:
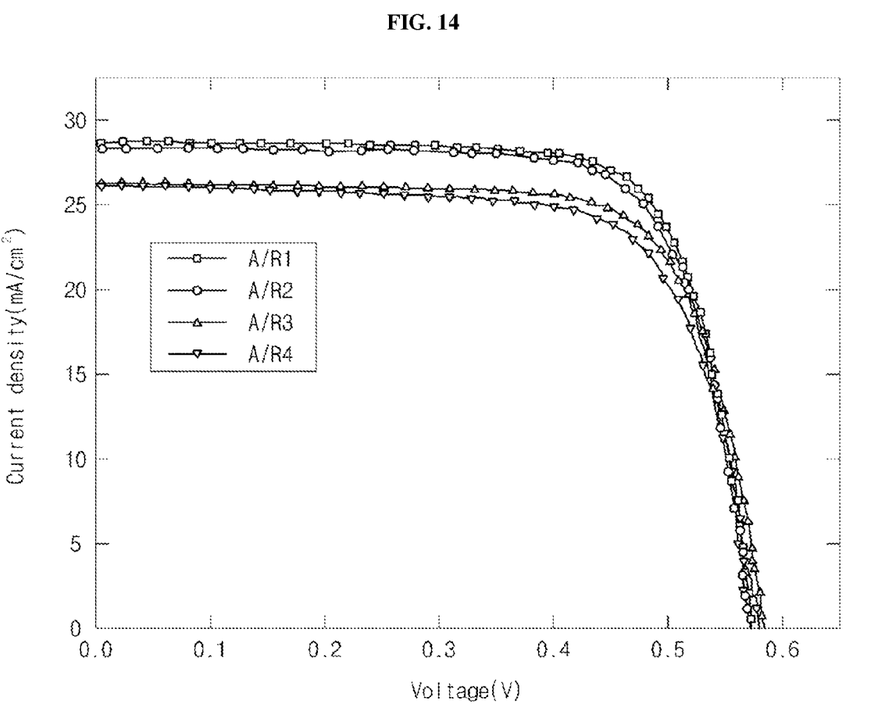
FIG. 14 is a graph in which current density is measured by varying an aspect ratio (A/R) as 1, 2, 3, and 4 from the results obtained in FIG. 13, after the etching time is fixed at 60 seconds (KOH).

FIG. 14 is a graph in which current density is measured by varying an aspect ratio (A/R) as 1, 2, 3, and 4 from the results obtained in FIG. 13, after the etching time is fixed at 60 seconds (KOH).

Also, the efficiency of the solar cell according to each condition from the graph of FIG. 14 is listed in Table 2. From Table 2, the highest efficiency may be achieved under the condition including an A/R of 1.

TABLE 2

| Aspect ratio | Voc (mV) | Jsc (mA/cm$^2$) | FF (%) | EFF (%) |
|---|---|---|---|---|
| 1 | 575 | 28.7 | 75.1 | 12.4 |
| 2 | 573 | 28.41 | 74.4 | 12.2 |
| 3 | 585 | 26.3 | 73.3 | 11.3 |
| 4 | 581 | 26.2 | 71.4 | 10.9 |

Herein, an open circuit voltage (Voc) is a voltage which is measured by opening electrode terminals of the solar cell. A short circuit current (Isc) is a current which flows when the electrode terminals of the solar cell are short-circuited, its unit is ampere (A), and short-circuit current density (Jsc), a current per unit area, is obtained by dividing the short circuit current by the area of the solar cell. A fill factor (FF) is a ratio of the product of maximum output voltage and maximum output current to the product of the open circuit voltage and the short-circuit current. Solar cell efficiency (EFF) is a ratio of the electrical output of the solar cell to the energy of the incident light per unit area, wherein the light energy under standard test conditions is 100 mW/cm$^2$ and the electrical output of the solar cell is a value obtained by multiplying the open circuit voltage (Voc), the short-circuit current density (Jsc), and the fill factor (FF).

The present disclosure provides a method of manufacturing a solar cell, in which microwires and nanowires may be simultaneously formed, and a solar cell manufactured thereby. The above descriptions are merely exemplary embodiments for implementing the method of manufacturing a solar cell according to the present disclosure and a solar cell manufactured thereby, so that the present disclosure is not limited thereto. The true scope of the present disclosure should be defined to the extent that those skilled in the art can make various modifications and changes thereto without departing from the scope of the disclosure, as defined by the appended claims.

The invention claimed is:

1. A method of manufacturing a solar cell, the method comprising:
    preparing a first conductive type semiconductor substrate having a first surface and a second surface;
    patterning a photoresist on the second surface of the first conductive type semiconductor substrate in such a manner that a planar form of the photoresist is a form in which a plurality of transverse lines and a plurality of vertical lines intersect;
    electroless etching the semiconductor substrate to form a microwire having a width of 1 μm to 3 μm and a height of 3 μm to 5 μm in a region corresponding to the photoresist and form a plurality of nanowires having a width of 1 nm to 100 nm and a height of 1 μm to 3 μm in a region not corresponding to the photoresist;
    doping the microwire and the nanowire with a second conductive type impurity using $POCl_3$;
    forming a first electrode on the first surface of the semiconductor substrate; and
    forming a second electrode on the microwire,
    wherein an efficiency, a ratio of an output to an incident light energy per unit area, of the solar cell is in a range of 10% to 13%.

2. The method of claim 1, wherein the electroless etching comprises:
    first immersing in which a protective layer is formed on the first surface of the semiconductor substrate and the semiconductor substrate is immersed in a mixed solution of a silver nitrate solution and a hydrofluoric acid solution;
    second immersing in which the semiconductor substrate having silver particles attached thereto from the silver nitrate solution is immersed in a mixed solution of a hydrogen peroxide solution and a hydrofluoric acid solution; and
    third immersing in which the semiconductor substrate is immersed in a mixed solution of a nitric acid solution and water to remove the silver particles.

3. The method of claim 2, wherein, in the first immersing, the silver nitrate solution has a concentration of 5 mM to 15 mM, and the hydrofluoric acid solution has a concentration of 2 mM to 8 mM.

4. The method of claim 2, wherein the hydrogen peroxide solution and the hydrofluoric acid solution of the second immersing each have a concentration of 2 mM to 8 mM.

5. The method of claim 2, wherein the nanowires are formed by the second immersing and the second immersing is performed for 1 minute to 12 minutes.

6. The method of claim 2, wherein the electroless etching further comprises second electroless etching in which the nanowires are etched to form a flat groove area by immersing the semiconductor substrate in a mixed solution of a potassium hydroxide solution and water, after first electroless etching including the first, second, and third immersing.

7. The method of claim 1, wherein the electroless etching comprises:
    forming microwires in which the microwires are formed by patterning the photoresist on the second surface of the first conductive type semiconductor substrate;
    depositing $AgNO_3$ in which the $AgNO_3$ is deposited on the second surface of the first conductive type semiconductor substrate on which the microwires are not formed; and
    forming nanowires in which the nanowires are formed by etching the $AgNO_3$ with a KOH solution.

8. The method of claim 1, wherein the second conductive type impurity doping using the $POCl_3$ is performed at 820° C. to 880° C.

* * * * *